(12) United States Patent
Uno et al.

(10) Patent No.: US 8,937,374 B2
(45) Date of Patent: Jan. 20, 2015

(54) SEMICONDUCTOR PACKAGE, METHOD AND MOLD FOR PRODUCING SAME, INPUT AND OUTPUT TERMINALS OF SEMICONDUCTOR PACKAGE

(71) Applicant: Panasonic Corporation, Osaka (JP)

(72) Inventors: Takashi Uno, Hyogo (JP); Hikaru Ikeda, Osaka (JP); Kazuhiro Yahata, Osaka (JP); Motoyoshi Iwata, Osaka (JP); Hiroshi Naitou, Osaka (JP); Tomohide Kamiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/003,816

(22) PCT Filed: Oct. 24, 2012

(86) PCT No.: PCT/JP2012/006798
§ 371 (c)(1),
(2) Date: Sep. 9, 2013

(87) PCT Pub. No.: WO2013/094101
PCT Pub. Date: Jun. 27, 2013

(65) Prior Publication Data
US 2014/0077345 A1    Mar. 20, 2014

(30) Foreign Application Priority Data

Dec. 22, 2011    (JP) ................. 2011-282121

(51) Int. Cl.
*H01L 23/66*    (2006.01)
*H01L 21/56*    (2006.01)
(Continued)

(52) U.S. Cl.
CPC ............ *H01L 21/56* (2013.01); *H01L 23/3135* (2013.01); *H01L 21/561* (2013.01);
(Continued)

(58) Field of Classification Search
CPC .......... H01L 23/66; H01I 23/28; H01I 23/498
USPC ........... 257/664, 666, 676, 787; 438/122, 123
See application file for complete search history.

(56) References Cited

U.S. PATENT DOCUMENTS 5,777,380 A    7/1998  Otsuki et al.
6,025,640 A    2/2000  Yagi et al.
(Continued)

FOREIGN PATENT DOCUMENTS

JP    63-26905    2/1988
JP    4-181764    6/1992
(Continued)

OTHER PUBLICATIONS

International Search Report issued Nov. 27, 2012 in International (PCT) Application No. PCT/JP2012/006798.

*Primary Examiner* — Roy Potter
(74) *Attorney, Agent, or Firm* — Wenderoth, Lind & Ponack, LLP.

(57) ABSTRACT

A semiconductor package according to the present invention includes: a semiconductor element where a high frequency signal is input or output; a planar lead terminal having an end electrically connected to an input terminal or an output terminal of the semiconductor element; an encapsulation resin for encapsulating the lead terminal and the semiconductor element, the lead terminal having another end exposed from the resin; and a ground enhancing metal body encapsulated in the encapsulation resin, having a first main surface facing the lead terminal and a second main surface exposed from the encapsulation resin, wherein the ground enhancing metal body has a shape with a cross section parallel to the second main surface and having a smaller area than an area of the first main surface.

18 Claims, 8 Drawing Sheets

(51) Int. Cl.
*H01L 23/31* (2006.01)
*H01L 23/00* (2006.01)
*H01L 23/433* (2006.01)
*H01L 23/28* (2006.01)
*H01L 23/498* (2006.01)
*H01L 23/495* (2006.01)

(52) U.S. Cl.
CPC ........... *H01L 24/97* (2013.01); *H01L 23/4334* (2013.01); *H01L 23/562* (2013.01); *H01L 23/66* (2013.01); *H01L 23/28* (2013.01); *H01L 23/498* (2013.01); *H01L 23/49568* (2013.01); *H01L 21/565* (2013.01); *H01L 2224/32245* (2013.01); *H01L 2224/48247* (2013.01); *H01L 2224/49175* (2013.01); *H01L 2224/73265* (2013.01); *H01L 2224/97* (2013.01); *H01L 2924/13091* (2013.01); *H01L 2924/3011* (2013.01); *H01L 23/3107* (2013.01)
USPC .......................................... 257/666; 257/664

(56) References Cited

U.S. PATENT DOCUMENTS

| | | | |
|---|---|---|---|
| 6,201,292 | B1 | 3/2001 | Yagi et al. |
| 6,818,973 | B1 * | 11/2004 | Foster ............... 257/676 |
| 7,556,987 | B2 * | 7/2009 | Dimaano et al. ....... 438/123 |

FOREIGN PATENT DOCUMENTS

| | | |
|---|---|---|
| JP | 05-183098 | 7/1993 |
| JP | 06-302769 | 10/1994 |
| JP | 07-211855 | 8/1995 |
| JP | 08-321521 | 12/1996 |
| JP | 2580674 | 2/1997 |
| JP | 2655501 | 9/1997 |
| JP | 10-004169 | 1/1998 |
| JP | 10-209194 | 8/1998 |
| JP | 11-233683 | 8/1999 |
| JP | 11-243166 | 9/1999 |
| JP | 2005-101670 | 4/2005 |
| JP | 2006-310425 | 11/2006 |
| JP | 2011-187684 | 9/2011 |

* cited by examiner

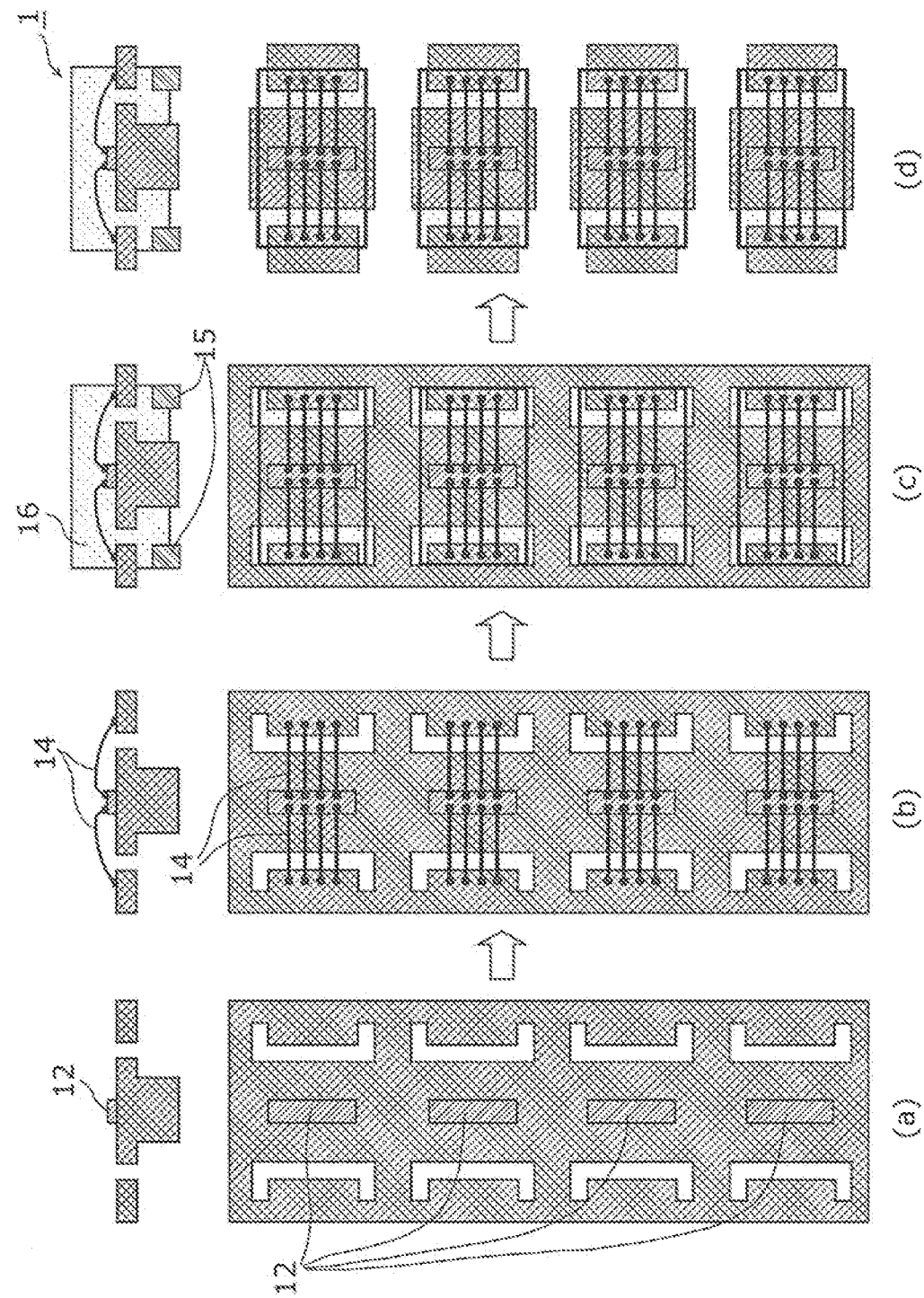

SEMICONDUCTOR PACKAGE, METHOD AND MOLD FOR PRODUCING SAME, INPUT AND OUTPUT TERMINALS OF SEMICONDUCTOR PACKAGE

TECHNICAL FIELD

The present invention relates to a semiconductor package, a method and a mold for fabricating the same, and input and output terminals of the semiconductor package, and in particular to a resin-encapsulated semiconductor package for a high frequency semiconductor device which outputs a high frequency signal at a high level.

BACKGROUND ART

Resin-encapsulated packages can be fabricated in large quantities at a low cost, and thus are most widely used as packages of semiconductor elements for general use.

However, an encapsulation resin has low permittivity, and thus flexibility is low in designing characteristic impedance of lead terminals through which a high frequency signal is input to and output from a semiconductor element. There are few examples in which resign-encapsulated packages are used when a high frequency signal of hundreds of MHz or more is involved. In particular, since a high-power semiconductor element has a large chip size, the input/output impedance of the semiconductor element itself is low, and a mismatch is likely to occur between the input/output impedance and the impedance of a load circuit including characteristic impedance of a lead terminal of a package.

Patent Literature (PTL) 1 discloses, as a technique of designing characteristic impedance of lead terminals, a method in which ground leads are provided on both sides of each signal lead, the widths of the signal leads and the ground leads, and the intervals therebetween are adjusted, and the signal leads are caused to function as coplanar distributed constant lines.

Furthermore, PTL 2 discloses a package structure for causing lead terminals to function as microstrip distributed constant lines.

FIG. 8 is a cross-sectional view illustrating a structure of a mold package disclosed in PTL 2. In a conventional mold package 500 illustrated in the drawing, a first resin 503 is molded first to incorporate first external leads 502 connected to electrodes of a semiconductor element 501. Then, second external leads 504 which form metal layers are placed on the resin molded first, and a second resin 505 is molded second to incorporate the first external leads 502 and the second external leads 504, together with the resin molded first. Specifically, in the mold package 500, the first external leads 502 inside the molded resin, which serve as inner leads for signals, face the second external leads 504 that form ground metal layers, thereby achieving lead terminals which function as microstrip distributed constant lines.

CITATION LIST

Patent Literature

[PTL 1] Japanese Patent No. 2580674
[PTL 2] Japanese Patent No. 2655501

SUMMARY OF INVENTION

Technical Problem

However, the lead terminal structure disclosed in PTL 1 requires the ground leads facing the signal leads to have a width three times or more the width of the signal leads, in order to cause the signal leads to function as coplanar distributed constant lines.

Furthermore, although the lead terminal structure disclosed in PTL 2 can reduce the size of the package, a great transmission loss may be caused at a lead terminal in a high frequency band of 1 GHz or more, for example.

Furthermore, the mold package 500 disclosed in PTL 2 requires equipment investment to adjust and change characteristic impedance.

The present invention is conceived in light of the above problems, and an object thereof is to provide an inexpensive semiconductor package having excellent high frequency characteristics, on which a high-frequency, high-power semiconductor element is mounted, a method and a mold for fabricating the same, and input and output terminals of the semiconductor package.

Solution to Problem

In order to solve the above problems, a semiconductor package according to an aspect of the present invention includes a semiconductor element where a high frequency signal is input and/or output; a planar lead for transmitting the high frequency signal to the semiconductor element or an external circuit, the lead having an end electrically connected to an input terminal or an output terminal of the semiconductor element; a resin for encapsulating the lead and the semiconductor element, the lead having another end exposed from the resin; and an electric conductor for ground enhancement having a first main surface and a second main surface opposite to the first main surface, and encapsulated in the resin, the first main surface facing the lead with the resin therebetween, the second main surface being exposed from the resin, wherein the electric conductor has a shape with a cross section parallel to the second main surface and having a smaller area than an area of the first main surface.

Advantageous Effects of Invention

According to the present invention, in a resin-encapsulated package, an electric conductor for ground enhancement can be firmly grounded, and furthermore the phase advance relative to a ground surface can also be reduced. Thus, an inexpensive semiconductor package having excellent high frequency characteristics can be provided on which a high-frequency, high-power semiconductor element is mounted.

BRIEF DESCRIPTION OF DRAWINGS

FIG. 5 illustrates a process flow for fabricating the semiconductor packages according to the present invention from the lead frame.

DESCRIPTION OF EMBODIMENTS

Figure 1:
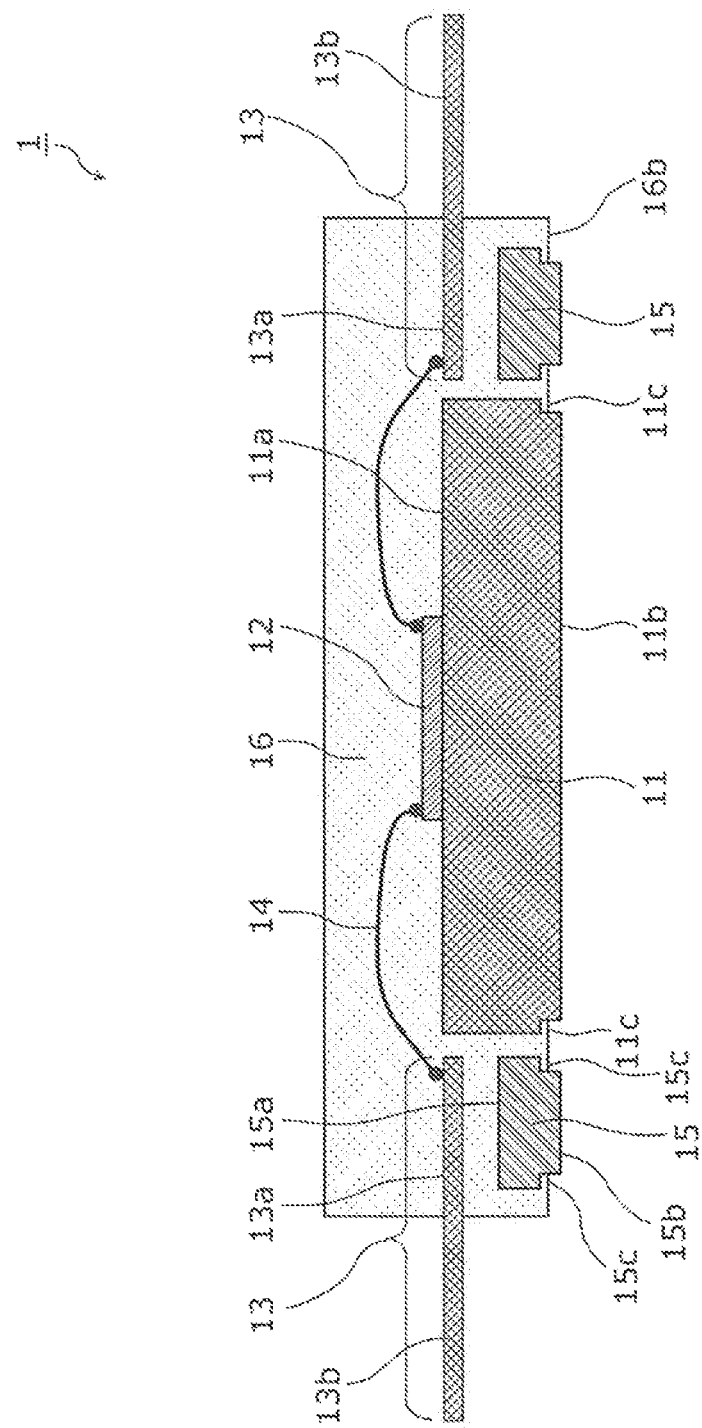
FIG. 1 is a cross-sectional view of a structure of a semiconductor package according to Embodiment 1 of the present invention.

Underlying Knowledge Forming Basis of the Present Invention

The inventors of the present invention have found that the semiconductor package described in the "Background Art" section has problems below.

In the lead terminal structure disclosed in PTL 1, the width of ground leads facing signal leads needs to be three times or more the width of the signal leads in order to cause the signal leads to function as coplanar distributed constant lines. Typically, the width of the signal leads is substantially equal to the chip size of a semiconductor element, and in particular, a high-power semiconductor element needs to have a large chip size, that is, a chip size of 5 mm or more, which inevitably increases the size of a package.

Furthermore, although the lead terminal structure disclosed in PTL 2 allows the size of a package to be reduced, a problem arises when handling a high frequency signal of 1 GHz or more, for example. In this case, a firmly grounded layer at a signal frequency is necessary in order to cause signal leads to function as microstrip distributed constant lines. However, with the mold package 500 disclosed in PTL 2, the grounding strength of second external leads 504 that are to function as a ground layer is insufficient, due to a resistance component and a phase component of the second external leads 504 facing signal inner leads. This insufficient grounding strength may cause a large transmission loss at a lead terminal.

Furthermore, regarding the mold package 500 disclosed in PTL 2, the characteristic impedance of the inner leads is determined according to the thickness of the first resin 503, and thus it is necessary to change the thickness of the first resin 503 when adjusting the characteristic impedance. In other words, a mold for molding the first resin 503 needs be changed in order to adjust and change the characteristic impedance, which requires equipment investment each time such change is made.

In order to solve such problems, a semiconductor package according to an aspect of the present invention includes a semiconductor element where a high frequency signal is input and/or output; a planar lead for transmitting the high frequency signal to the semiconductor element or an external circuit, the lead having an end electrically connected to an input terminal or an output terminal of the semiconductor element; a resin for encapsulating the lead and the semiconductor element, the lead having another end exposed from the resin; and an electric conductor for ground enhancement having a first main surface and a second main surface opposite to the first main surface, and encapsulated in the resin, the first main surface facing the lead with the resin therebetween, the second main surface being exposed from the resin, wherein the electric conductor has a shape with a cross section parallel to the second main surface and having a smaller area than an area of the first main surface.

According to this aspect, regarding the electric conductor for ground enhancement which forms a microstrip line with the lead, the second main surface of the electric conductor is exposed from the resin by the first main surface facing the lead with the resin therebetween. Accordingly, the second main surface of the electric conductor is in direct contact with a ground surface on which the package is mounted. Thus, the grounding strength can be improved which influences transmission characteristics of the microstrip line. Therefore, the semiconductor package having low-loss high frequency characteristics can be provided using an inexpensive resin.

Furthermore, preferably, the semiconductor package further includes a planar die pad having a top surface on which the semiconductor element is disposed, wherein the die pad is encapsulated in the resin such that at least a portion of an undersurface of the die pad is exposed from the resin.

Accordingly, the undersurface of the die pad exposed from the resin is directly screwed or soldered to a module case or a heat sink, thereby allowing heat generated by the semiconductor element to be effectively dissipated.

Furthermore, a top surface of the lead and the top surface of the die pad may be located on a same plane.

Accordingly, the top surfaces of the semiconductor element and the planar lead are on substantially the same plane, which produces no level difference therebetween. Thus, the lead frame structure is simplified and the bonding wire is formed with ease, and consequently a fabricating process is simplified.

Furthermore, a distance between a side surface of the die pad facing the lead and a side surface of the lead facing the die pad may be equal to a distance between the side surface of the die pad facing the electric conductor and a side surface of the electric conductor facing the die pad.

Accordingly, a change in the characteristic impedance at an edge portion of a microstrip line formed by the planar lead, the electric conductor, and the resin included therebetween on a side close to the die pad can be minimized, and thus a transmission loss in a border area can be reduced.

Furthermore, the lead and the die pad may include a same material.

Accordingly, the semiconductor package according to the present invention can be fabricated using a lead frame which integrally includes the lead and the die pad having a fixed positional relationship therebetween. Thus, wire bonding is stabilized in a mounting process, and the lead and the die pad are positioned with ease in a resin encapsulation process, which simplifies the fabricating process.

Furthermore, the second main surface of the electric conductor may be located on a same side as the undersurface of the die pad, relative to the lead.

Accordingly, the second main surface of the electric conductor and the undersurface of the die pad can be in contact with the same mount surface of a high frequency substrate, an aluminum case, a heat sink, or the like on which the semiconductor package is mounted. Thus, the mounting process for ground enhancement in view of high frequency transmission characteristics and dissipation of heat of the semiconductor element can be effectively achieved in a simple manner.

Furthermore, the second main surface of the electric conductor may be located on a same plane as the undersurface of the die pad.

Accordingly, the second main surface of the electric conductor and the back surface of the die pad are in contact with a ground surface on which the package is mounted in a further tightly fitted manner when the package is mounted, which achieves uniform heat dissipation characteristics.

Furthermore, the electric conductor may be part of the die pad.

Accordingly, it is possible to fabricate the semiconductor package according to the present invention using the lead frame in which the electric conductor and the die pad are formed in one. Furthermore, the electric conductor and the die pad which are formed in one can be simultaneously brought into contact with the same mounting surface of a high frequency substrate on which the semiconductor package is mounted, the mounting process for ground enhancement in view of high frequency transmission characteristics and dissipation of heat of a semiconductor element can be effectively achieved in a simple manner.

Preferably, the lead is thinner than the die pad.

Accordingly, the space between the lead and the electric conductor can be secured, and thus the flexibility increases in adjusting the thickness of a resin between the lead and the electric conductor, which influences the characteristic impedance of a microstrip line.

Preferably, when a direction parallel to the first main surface and perpendicular to a direction in which the high frequency signal is transmitted is a width direction, the electric conductor is larger in width than the lead in a portion in which the lead and the electric conductor face each other.

Accordingly, the microstrip line formed by the lead, the electric conductor, and the resin has even density of electric lines of force from the lead to the electric conductor, and a low-loss transmission characteristic can be secured.

Preferably, the die pad has a shape with a cross section parallel to the undersurface and having a smaller area than an area of the top surface.

Accordingly, the resin holds the die pad, which prevents the die pad from being separated and detached from the resin.

Preferably, the electric conductor has a shape with a cross section parallel to the second main surface and having a smaller area than an area of the first main surface.

Accordingly, the resin holds the electric conductor for ground enhancement, which prevents the electric conductor from being separated and detached from the resin.

Preferably, the at least a portion of the undersurface of the die pad exposed from the resin is projecting out from a surface of the resin surrounding the portion.

According to this aspect, is possible to more reliably prevent the resin from extending to the undersurface of the die pad when the resin is molded. If the resin extends to the undersurface of the die pad when the resin is molded, the resin having low thermal conductivity will be interposed between a heat dissipation surface of a heat sink or the like and the undersurface of the die pad. In that case, the effective area in which the die pad and the heat dissipation surface of a heat sink or the like are in direct contact decreases, which may prevent effective dissipation of heat generated by the semiconductor element.

Preferably, the second main surface of the electric conductor is projecting out from a surface of the resin surrounding the second main surface.

According to the aspect, it is possible to more reliably prevent the resin from extending to the second main surface of the electric conductor when the resin is molded. If the resin extends to the second main surface of the electric conductor for ground enhancement when the resin is molded, a resin which forms an insulating layer will be interposed between the ground surface of a heat sink or the like and the electric conductor. As a result, the effective area in which the ground surface of a heat sink or the like and the electric conductor are in direct contact decreases, which may reduce the effect achieved by bringing the electric conductor into contact with the ground surface.

It should be noted that the present invention can be achieved not only as a semiconductor package which includes such a distinctive means, but also as a method for fabricating a semiconductor package, which includes a process for a distinctive means included in the semiconductor package.

In order to solve the above problems, a method for fabricating a semiconductor package according to the present invention includes (a) electrically connecting an input terminal or an output terminal of a semiconductor element where a high frequency signal is input and/or output, and a planar lead for transmitting the high frequency signal to the semiconductor element or an external circuit; (b) disposing, at a predetermined position in a mold, an electric conductor for ground enhancement having a first main surface and a second main surface opposite to the first main surface, the second main surface being in contact with an inner surface of the mold; (c) disposing part of the lead and the semiconductor element in an internal space of the mold, the lead facing the first main surface; and (d) injecting a resin into the internal space of the mold, wherein in step (c), the lead is disposed such that the resin is included between the lead and the first main surface.

According to this aspect, in the preparation for step (d), the second main surface of the electric conductor is disposed in contact with the inner surface of the mold for resin molding, and thus the second main surface can be exposed from the resin after molding the resin. Therefore, the second main surface is in direct contact with the ground surface on which the package is mounted. Thus, grounding strength important for transmission characteristics of a microstrip line can be increased, and a semiconductor package having low-loss high frequency characteristics can be provided using an inexpensive resin.

Preferably, the method for fabricating the semiconductor package further includes before step (a): (e) preparing a lead frame which integrally includes a planar die pad and the lead; and (f) die-bonding the semiconductor element onto a top surface of the die pad, wherein in step (c), the lead frame is disposed at a predetermined position in the mold such that at least a portion of an undersurface of the die pad is in contact with the inner surface of the mold.

Accordingly, in the preparation for step (d), at least a portion of the undersurface of the die pad is disposed in contact with the inner surface of the mold for resin molding. Thus, the undersurface can be exposed from the resin after resin molding. Accordingly, the undersurface of the die pad exposed from the resin is directly screwed or soldered to a module case or a heat sink, thereby allowing effective dissipation of heat generated by the semiconductor element.

Furthermore, in step (c), the die pad may be fitted into a recessed portion formed in the inner surface of the mold such that the at least a portion of the undersurface of the die pad may be in contact with the inner surface of the mold.

Accordingly, in the preparation for step (d), at least a portion of the undersurface of the die pad can be disposed in contact with the inner surface of the mold for resin molding, and also the die pad can be positioned. At the same time, in step (d), the undersurface of the die pad is made projecting out from the resin injecting space, and thus it is possible to more reliably prevent the resin from extending to the undersurface of the die pad.

Furthermore, in step (c), the die pad may be sucked through a suction opening formed in the mold to bring the at least a portion of the undersurface of the die pad into contact with the inner surface of the mold.

Accordingly, in the preparation for step (d), at least a portion of the undersurface of the die pad can be disposed being sucked onto the inner surface of the mold for resin molding, and also the die pad can be positioned.

Furthermore, in step (b), the electric conductor may be fitted into a recessed portion formed in the inner surface of the mold such that the second main surface may be in contact with the inner surface of the mold.

Accordingly, in the preparation for step (d), the second main surface of the electric conductor can be disposed in contact with the inner surface of the mold for resin molding, and also the electric conductor can be positioned. At the same time, in step (d), the second main surface can be made projecting out from the resin injecting space, and thus it is possible to more reliably prevent the resin from extending to the second main surface.

Furthermore, in step (b), the electric conductor may be sucked through a suction opening formed in the mold to bring the second main surface into contact with the inner surface of the mold.

Accordingly, in the preparation for step (d), the second main surface of the electric conductor can be disposed being sucked onto the inner surface of the mold for resin molding, and also the electric conductor can be positioned.

It should be noted that the present invention can be achieved not only as the semiconductor package including the distinctive means and a method for fabricating a semiconductor package which includes a distinctive process, but also as a mold for a semiconductor package which has a distinctive structure.

In order to solve the above problems, a mold for a semiconductor package according to the present invention, the semiconductor package including: a semiconductor element where a high frequency signal is input and/or output; a planar lead for transmitting the high frequency signal to the semiconductor element or an external circuit, the lead having an end electrically connected to an input terminal or an output terminal of the semiconductor element; a resin for encapsulating the lead and the semiconductor element, the lead having another end exposed from the resin; and an electric conductor for ground enhancement having a first main surface facing the lead and a second main surface opposite to the first main surface, and encapsulated in the resin, the second main surface being exposed from the resin, has a recessed portion which is formed in an internal surface, and in which the second main surface is in contact with the internal surface.

The mold according to this aspect is used in the process of fabricating the semiconductor package according to the present invention, which allows the second main surface of the electric conductor to be disposed with ease in contact with the inner surface of the mold for resin molding. At the same time, in step (d), the second main surface can be made projecting out from the resin injecting space, and thus it is possible to more reliably prevent the resin from extending to the second main surface. Therefore, the second main surface is in direct contact with the ground surface on which the package is mounted, and thus the grounding strength important for transmission characteristics of the microstrip line can be improved. Furthermore, the electric conductor is positioned with ease in the preparations for step (d), and thus a fabricating process can be simplified.

The characteristic impedance of the lead which forms a microstrip line depends on the thickness of a resin between the first main surface of the electric conductor and the flat surface of the lead. According to this aspect, without changing the mold of resin molding, only the thickness of the electric conductor for ground enhancement is adjusted, and the lead and the electric conductor are disposed at the predetermined position in the mold for resin molding, which allows the characteristic impedance of the lead to be changed. Therefore, it is unnecessary to change the mold for resin molding, and thus a wide variation of semiconductor package products can be achieved while exerting little influence on a product price.

Furthermore, the present invention can be achieved not only as the semiconductor package including the distinctive means described above, but also as an input or output terminal of a semiconductor package having a distinctive structure included in a semiconductor package.

In order to solve the above problems, an input or output terminal of a semiconductor package according to the present invention in which a semiconductor element is encapsulated in a resin includes: a planar lead which propagates a high frequency signal; a resin for encapsulating the lead and the semiconductor element, the lead having an end exposed from the resin; and an electric conductor for ground enhancement having a first main surface and a second main surface opposite to the first main surface, and encapsulated in the resin, the first main surface facing the lead, the second main surface being exposed from the resin, wherein the lead, the electric conductor, and the resin form a strip line or a microstrip line.

According to this, the back surface of the electric conductor for ground enhancement can be in direct contact with a ground surface, and thus it is possible to improve the grounding strength which influences transmission characteristics of a microstrip line. Therefore, low-loss high frequency signal transmission can be achieved using a resin which is an inexpensive material of a semiconductor package.

The following describes a semiconductor package according to embodiments of the present invention, with reference to the drawings. In addition, the same numerals are used for the same constituent elements in the drawings described below.

Embodiment 1

FIG. 1 is a cross-sectional view illustrating a structure of a semiconductor package according to Embodiment 1 of the present invention. A semiconductor package 1 illustrated in the drawing is a resin-encapsulated package, and includes: a die pad 11; a semiconductor element 12; plural lead terminals 13; bonding wires 14 which connect the semiconductor element 12 and inner lead portions 13a; ground enhancing metal bodies 15; and an encapsulation resin 16. It should be noted that a portion of each lead terminal 13 located inside the encapsulation resin 16 is referred to as the inner lead portion 13a, and a portion thereof located outside the encapsulation resin is referred to as an outer lead portion 13b.

The semiconductor element 12 is a high-frequency power amplifying element which is die-bonded onto a main surface 11a of the die pad 11, amplifies power of a high frequency signal input through one of the lead terminals 13, and outputs the high frequency signal whose power has been amplified through the other one of the lead terminal 13. It should be noted that as a semiconductor element mounted in a semiconductor package according to the present invention, not only an element that has a power amplification function as described above, but also an element which has a function of switching high frequency signals, for instance, can be used. In other words, a semiconductor element mounted in a semiconductor package according to the present invention may be a semiconductor element where a high frequency signal is input and/or output.

Examples of the semiconductor element 12 include a GaN-heterostructure field effect transistor (HFET), a GaAs-HFET, metal oxide semiconductor field effect transistor (MOSFET), a lateral double diffused MOSFET (LDMOS), a GaAs-heterojunction bipolar transistor (HBT), and the like.

The die pad 11 includes, for example, a material having a high thermal conductivity, such as copper, and is a plate having the main surface 11a corresponding to a top surface on which the semiconductor element 12 is mounted, and a back surface 11b corresponding to an undersurface exposed from the encapsulation resin 16. The back surface 11b of the die pad 11 exposed from the encapsulation resin 16 is directly screwed or soldered to a module case or a heat sink, thereby allowing effective dissipation of heat generated by the semiconductor element 12. Typically, an epoxy resin, for example, is used as an encapsulation resin material, and thus has thermal conductivity lower than a metal material such as copper by two or more digits. Thus, it is difficult to effectively dissipate heat generated by the semiconductor element at high power output if heat is dissipated through the encapsulation resin 16.

Each ground enhancing metal body 15 is an electric conductor for ground enhancement which has a main surface 15a which is a first main surface, and a back surface 15b which is a second main surface exposed from the encapsulation resin 16. The main surface 15a of the ground enhancing metal body 15 faces the inner lead portion 13a of the lead terminal 13 through part of the encapsulation resin 16. The ground enhancing metal body 15 includes a material having good electrical conduction such as copper, for example.

The lead terminals 13 are planar leads disposed by the side of the die pad 11, and each having the inner lead portion 13a electrically connected to an input terminal or an output terminal of the semiconductor element 12 by the bonding wire 14. The above connection allows the lead terminals 13 to transmit an input high frequency signal or an amplified output high frequency signal to the semiconductor element 12 or an external circuit. Here, the lead terminals 13 preferably are thinner than the die pad 11. Accordingly, a space between the lead terminals 13 and the ground enhancing metal bodies 15 can be secured, and thus the flexibility increases in adjusting the thickness of the encapsulation resin 16 in the space, which influences the characteristic impedance of microstrip lines.

The encapsulation resin 16 is a resin for encapsulating the die pad 11, the semiconductor element 12, the inner lead portions 13a, the bonding wires 14, and the ground enhancing metal bodies 15 in such a manner that the back surface 11b of the die pad 11, the outer lead portions 13b, and the back surfaces 15b of the ground enhancing metal bodies 15 are exposed.

The characteristic impedance of the inner lead portions 13a is determined based on the dielectric constant of the encapsulation resin 16, the width of the inner lead portions 13a, and a distance between the main surface 15a of each ground enhancing metal body 15 and the back surface of each inner lead portion 13a.

The above configuration allows a semiconductor package for high-frequency power amplification to be achieved using an inexpensive cheap resin. Furthermore, the back surfaces 15b of the ground enhancing metal bodies 15 which form microstrip lines together with the lead terminals 13 are exposed from the encapsulation resin 16. Thus, the back surfaces 15b of the ground enhancing metal bodies 15 are brought into direct contact with or soldered to a high frequency substrate or a module case on which the semiconductor package 1 is mounted, thereby increasing grounding strength important for high frequency transmission characteristics, and also reducing phase advance relative to the ground surface. Consequently, it is possible to provide an inexpensive semiconductor package having excellent high frequency characteristics, in which a high-frequency, high-power semiconductor element is mounted.

Furthermore, the characteristic impedance of the inner lead portions 13a can be changed by adjusting the thickness of the ground enhancing metal bodies 15, rather than changing the mold for molding the encapsulation resin 16. Therefore, the mold for molding the encapsulation resin 16 does not need to be changed, and a wide variation of products can be achieved while exerting little influence on a product price.

Furthermore, in the present embodiment, the back surfaces 15b of the ground enhancing metal bodies 15 are located on the same side as the back surface 11b of the die pad 11, relative to the lead terminals 13. This allows the back surfaces 15b of the ground enhancing metal bodies 15 and the back surface 11b of the die pad 11 to be in contact with the same mounting surface of a high frequency substrate, a module case, or the like on which the semiconductor package 1 is mounted. Thus, ground enhancement in view of high frequency transmission characteristics and a mounting process for dissipation of heat of the semiconductor element 12 can be effectively achieved with ease.

Furthermore, the back surfaces 15b of the ground enhancing metal bodies 15 are preferably located on the same plane as the back surface 11b of the die pad 11. Accordingly, the back surfaces 15b and the back surface 11b are in further tight contact with the high frequency substrate, the module case, or the like when the package is mounted, thereby achieving uniform heat dissipation characteristics.

It should be noted that in the semiconductor package according to the present invention, the back surfaces 15b of the ground enhancing metal bodies 15 may be located on an opposite side to the back surface 11b and of the die pad 11, relative to the lead terminals 13. A high frequency circuit board on which the semiconductor package according to the present invention is mounted often has a multilayer structure, and for example, a layer directly above a layer on which the semiconductor package is mounted may be a ground layer. Specifically, the semiconductor package according to the present invention for such a case may have a structure in which the back surface of the die pad is exposed from the bottom surface of the semiconductor package and attached to a mount layer while the back surface of the ground enhancing metal body is exposed from the top surface of the semiconductor package and attached to the ground layer.

Furthermore, as illustrated in FIG. 1, the back surface 11b of the die pad 11 is preferably projecting out relative to a back surface 16b of the encapsulation resin 16. This can more reliably prevent the encapsulation resin 16 from extending to the back surface 11b of the die pad 11 when the encapsulation resin 16 is molded. If the encapsulation resin 16 extends to the back surface 11b of the die pad 11 when the encapsulation resin 16 is molded, the encapsulation resin 16 having low thermal conductivity is included between a heat dissipation surface of a heat sink or the like and the back surface 11b of the die pad 11. Accordingly, the effective area decreases in which the heat dissipation surface of a heat sink or the like and the back surface 11b are in direct contact with or attached to each other, which may prevent heat generated by the semiconductor element 12 from being dissipated effectively.

Furthermore, the back surfaces 15b of the ground enhancing metal bodies 15 may be preferably projecting out relative to the back surface 16b of the encapsulation resin 16. Accordingly, it is possible to more reliably prevent the encapsulation resin 16 from extending to the back surfaces 15b of the ground enhancing metal bodies 15 when the encapsulation resin 16 is molded. If the encapsulation resin 16 extends to the back surfaces 15b of the ground enhancing metal bodies 15 when the encapsulation resin 16 is molded, the encapsulation resin 16 which serves as an insulating layer is included between the ground surface of a heat sink or the like and the ground enhancing metal bodies 15. Consequently, the effective area decreases in which the ground surface of a heat sink or the like and the ground enhancing metal bodies 15 are in direct contact with or attached to one another, which may decrease the effect of using the ground enhancing metal bodies 15 as a ground surface.

It should be noted that it is preferable to form, in a lower mold for molding the encapsulation resin 16, a recessed portion in which the back surface 11b of the die pad 11 fits in order to achieve a structure which allows the back surface 11b of the die pad 11 to be projecting out relative to the back surface 16b of the encapsulation resin 16 as described above. This also allows positioning of the die pad 11 in the mold when the encapsulation resin 16 is molded.

Similarly, it is preferable to form, in the lower mold, recessed portions shaped such that the back surfaces 15b of the ground enhancing metal bodies 15 fit in, in order to achieve a structure which allows the back surfaces 15b of the ground enhancing metal bodies 15 to be projecting out relative to the back surface 16b of the encapsulation resin 16. This also allows positioning of the ground enhancing metal bodies 15 in the mold when the encapsulation resin 16 is molded.

Furthermore, it is preferable to form a step in the edge portion of the bottom surface of the die pad 11 and to form a step having the same shape also in the above lower mold. Accordingly, it is possible to more effectively prevent the encapsulation resin 16 from extending to the back surface 11b of the die pad 11.

Similarly, it is preferable to form a step in the edge portion of the bottom surface of each ground enhancing metal body 15, and to form a step having the same shape also in the above lower mold. Accordingly, it is possible to more effectively prevent the encapsulation resin 16 from extending to the back surfaces 15b of the ground enhancing metal bodies 15.

Furthermore, as illustrated in FIG. 1, it is preferable to provide cutouts 11c at the edge portions of the back surface 11b of the die pad 11. The cutouts 11c are provided so as to be buried in the encapsulation resin 16, whereby the encapsulation resin 16 holds the die pad 11. Consequently, it is possible to prevent the die pad 11 from being separated and detached from the encapsulation resin 16. Here, the cutouts 11c are recessed portions provided in the side surfaces of the die pad 11. In the semiconductor package 1 illustrated in FIG. 1, the cutouts 11c covered with the encapsulation resin 16 are substantially the same as the step at each edge portion of the bottom surface of the die pad 11, and the structure including the cutouts 11c is achieved by, for example, setting the height of a step provided for the back surface 11b of the die pad 11 to fit in the above lower mold to a height lower than the height of a step formed at each edge portion of the bottom surface of the die pad 11.

Similarly, as illustrated in FIG. 1, cutouts 15c are provided at the edge portions of the back surfaces 15b of the ground enhancing metal bodies 15 so as to be buried in the encapsulation resin 16, whereby the encapsulation resin 16 holds the ground enhancing metal bodies 15. Consequently, it is possible to prevent the ground enhancing metal bodies 15 from being separated and detached from the encapsulation resin 16. Here, the cutouts 15c are recessed portions provided in the side surfaces of the ground enhancing metal bodies 15. In the semiconductor package 1 illustrated in FIG. 1, the cutouts 15c covered with the encapsulation resin 16 are substantially the same as the step at each edge portion of the bottom surfaces of the ground enhancing metal bodies 15, and the structure including the cutouts 15c is achieved by, for example, setting the height of a step provided for the back surfaces 15b of the ground enhancing metal bodies 15 to fit in the above lower mold to a height lower than the height of a step formed at each edge portion of the bottom surfaces of the ground enhancing metal bodies 15.

It should be noted that the shapes of the cutouts 11c provided at the edge portions of the back surface 11b of the die pad 11 and the cutouts 15c provided at the edge portions of the back surfaces 15b of the ground enhancing metal bodies 15 are not limited to the step shapes illustrated in FIG. 1, the cutouts 11c may be portions provided so as to be covered with the encapsulation resin 16, and having a shape which changes linearly or smoothly from the edge portions of the back surface 11b having a smaller area than the main surface 11a of the die pad 11 toward the edge portions of the main surface 11a, in order to prevent the die pad 11 from being separated and detached from the encapsulation resin 16. Similarly, the cutouts 15c may be portions provided so as to be covered with the encapsulation resin 16, and having a shape which changes linearly or smoothly from the edge portions of the back surfaces 15b having a smaller area than the main surfaces 15a of the ground enhancing metal bodies 15 toward the edge portions of the main surfaces 15a, in order to prevent the ground enhancing metal bodies 15 from being separated or detached from the encapsulation resin 16.

Specifically, the die pad 11 may be shaped such that a cross section parallel to the back surface 11b of the die pad 11 has an area smaller than the main surface 11a, and the portion at the cross section having a smaller area than the main surface 11a is covered with the encapsulation resin 16, in order to prevent the die pad 11 from being separated or detached from the encapsulation resin 16. In other words, even if the area of the back surface 11b of the die pad 11 is larger than or equal to the area of the main surface 11a, it is sufficient if narrow-shaped cutouts be provided between the main surface 11a and the back surface 11b, and the cutouts be covered with the encapsulation resin 16. Similarly, the ground enhancing metal bodies 15 may be shaped such that a cross section parallel to the back surfaces 15b of the ground enhancing metal bodies 15 has a smaller area than the main surfaces 15a, and the portions at the cross section having a smaller area than the main surfaces 15a are provided so as to be covered with the encapsulation resin 16, in order to prevent the ground enhancing metal bodies 15 from being separated or detached from the encapsulation resin 16. In other words, even if the area of the back surfaces 15b of the ground enhancing metal bodies 15 is greater than or equal to the area of the main surfaces 15a, it is sufficient if narrow-shaped cutouts be provided between the main surfaces 15a and the back surfaces 15b, and the cutouts be covered with the encapsulation resin 16.

Furthermore, the top surfaces of the lead terminals 13 and the main surface 11a of the die pad 11 are preferably located on the same plane. Accordingly, the top surfaces of the semiconductor element 12 and the lead terminals 13 are on substantially the same plane, which produces no level difference therebetween, and thus the bonding wires 14 are formed with ease, and a fabricating process is simplified.

Furthermore, a distance between the side surface of the die pad 11 facing the lead terminal 13 and the side surface of the lead terminal 13 facing the die pad 11 is preferably equal to a distance between the side surface of the die pad 11 facing the ground enhancing metal body 15 and the side surface of the ground enhancing metal body 15 facing the die pad 11. As a result, a change in characteristic impedance at the edge portion of a side where a microstrip line formed by the lead terminal 13, the ground enhancing metal body 15, and the encapsulation resin 16 included therebetween, which is closer to the die pad 11, can be minimized, and thus a transmission loss in a border area can be reduced.

Figure 2:
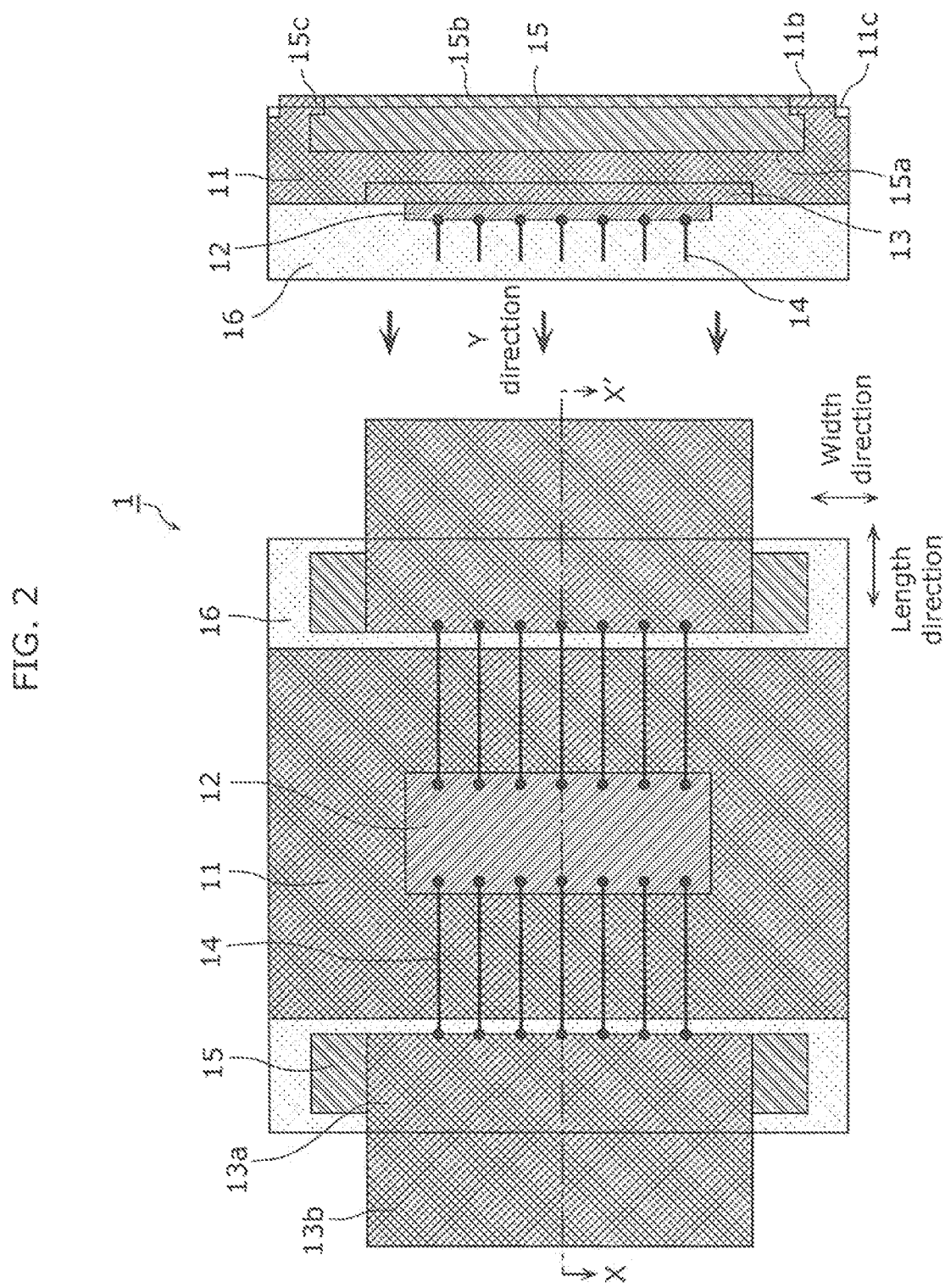
FIG. 2 is a perspective view of a top surface and a side surface of the semiconductor package according to Embodiment 1 of the present invention.

FIG. 2 illustrates perspective views of a top surface and a side surface of the semiconductor package according to Embodiment 1 of the present invention. It should be noted that a cross-sectional view of the structure of the semiconductor package 1 illustrated in FIG. 1 corresponds to a cross-sectional view taken along X-X' in the perspective view of the top surface of the semiconductor package 1 illustrated in FIG. 2. Furthermore, the perspective view of the side surface of the semiconductor package 1 illustrated in FIG. 2 corresponds to the perspective view observed in the direction in which a high frequency signal is input and output (corresponding to the Y direction in the drawing).

As illustrated in the perspective view of the top surface in FIG. 2, in the semiconductor package 1 according to Embodiment 1, the plural bonding wires 14 having substantially the same length connect the inner lead portions 13a of the lead terminals 13 to the semiconductor element 12 at substantially the same intervals, in correspondence with plural input pads and plural output pads provided on the semiconductor element 12. Furthermore, as illustrated in the perspective view of the side surface in FIG. 2, the lead terminals 13 and the ground enhancing metal bodies 15 face with part of the encapsulation resin 16 therebetween, which includes a dielectric material.

In the following, in the top view of FIG. 2, the direction in which a high frequency signal flows from the input to the output is defined as a length direction, and a direction perpendicular to the flow of a high frequency signal is defined as a width direction when one of the lead terminals 13 is an input terminal, whereas the other terminal 13 is an output terminal.

Here, the ground enhancing metal body 15 is preferably wider than the inner lead portion 13a in a portion in which the lead terminal 13 and the ground enhancing metal body 15 face each other. In order to utilize the inner lead portion 13a as a microstrip distributed constant line, it is necessary to equalize density of electric lines of force from the inner lead portion 13a to the ground enhancing metal body 15. If the ground enhancing metal body 15 has a narrower width than the inner lead portion 13a, the area of a ground layer is insufficient, which causes transmission loss. Furthermore, the amount of the ground enhancing metal body 15 protruding from the inner lead portion 13a in the width direction when viewed from the top surface of the semiconductor package is preferably larger than the distance between the inner lead portion 13a and the ground enhancing metal body 15 facing each other.

It should be noted that in the semiconductor package 1 illustrated in FIG. 2, the ground enhancing metal body 15 has a narrower width than the encapsulation resin 16, and is within the encapsulation resin 16 in the width direction. However, the width of the ground enhancing metal body 15 may be set to a width equal to or broader than the width of the encapsulation resin 16. This increases an area in which a ground surface of a heat sink or the like and the ground enhancing metal body 15 are in contact, and also makes the ground enhancing metal body 15 in further tight contact with the ground surface, thus achieving greater reduction in contact resistance and transmission loss.

Furthermore, although the semiconductor package 1 illustrated in FIG. 2 has a structure in which the die pad 11 and the encapsulation resin 16 has the same width, the semiconductor package 1 may have a structure in which the die pad 11 is wider than the encapsulation resin 16 and thus exposed in the width direction, or conversely, a structure in which the die pad 11 is narrower than the encapsulation resin 16 and thus is within the encapsulation resin 16 in the width direction.

Furthermore, although the ground enhancing metal body 15 has a shorter length than the inner lead portion 13a and is within the encapsulation resin 16 in the length direction in the semiconductor package 1 illustrated in FIG. 2, the ground enhancing metal body 15 may have a longer length than the inner lead portion 13a, be exposed beyond the encapsulation resin 16 in the length direction, and extending towards the outer lead portion 13b. This can fix the characteristic impedance of the inner lead portion 13a, and reduce transmission loss due to impedance mismatch. Furthermore, an area increases in which a ground surface of a heat sink or the like and the ground enhancing metal body 15 are in contact, thus achieving greater reduction in contact resistance and transmission loss.

It should be noted that although the semiconductor package 1 illustrated in FIGS. 1 and 2 has a structure in which the semiconductor element 12 and the lead terminals 13 are directly connected using the bonding wires 14, a matching circuit board may be disposed between the semiconductor element 12 and the lead terminals 13, and the semiconductor element 12 and the lead terminals 13 may be connected via the matching circuit board using bonding wires.

Embodiment 2

Figure 3:
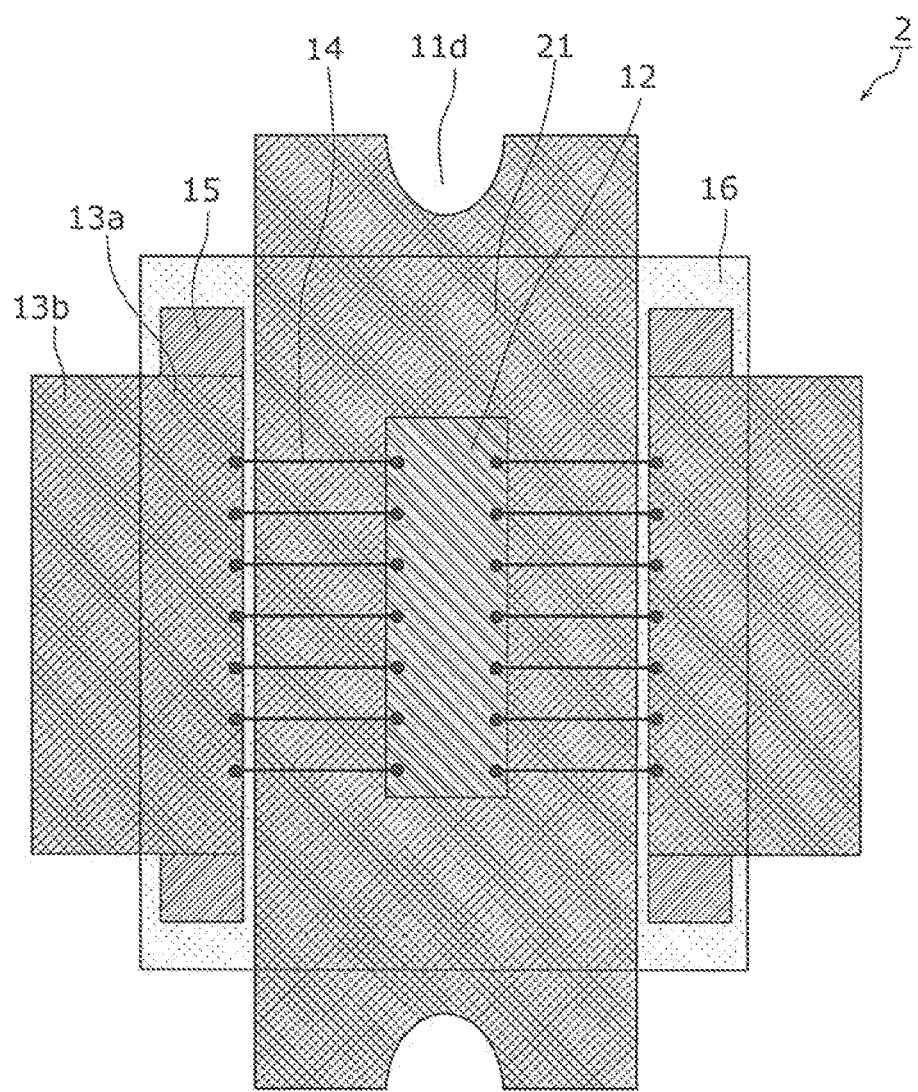
FIG. 3 is a perspective view of a top surface of a semiconductor package according to Embodiment 2 of the present invention.

FIG. 3 is a perspective view of a top surface of a semiconductor package according to Embodiment 2 of the present invention. A semiconductor package 2 illustrated in the drawing is a resin-encapsulated package, and includes a die pad 21, a semiconductor element 12, plural lead terminals 13, bonding wires 14, a ground enhancing metal body 15, and an encapsulation resin 16. Compared with the semiconductor package 1 according to Embodiment 1, the semiconductor package 2 according to the present embodiment is different therefrom in the following points: the die pad 21 has a greater width than the encapsulation resin 16, and cutouts 11d for screwing are provided in the areas of the die pad 21 projecting from the encapsulation resin 16 in the width direction. A description of the same points as the semiconductor package 1 according to Embodiment 1 is omitted, and the following describes only points different from the semiconductor package 1.

The die pad 21 is a flat plate including a material having high thermal conductivity such as copper, for example, and having a main surface on which the semiconductor element 12 is mounted, and a back surface exposed from the encapsulation resin 16.

The above configuration allows a semiconductor package used for amplifying high-frequency power to be achieved using an inexpensive resin. Furthermore, a back surface 15b of the ground enhancing metal body 15 which forms a microstrip line together with the lead terminal 13 is exposed from the encapsulation resin 16, whereby grounding strength important for high frequency transmission characteristics can be increased, and the phase advance from a ground surface can also be reduced at the same time. Thus, it is possible to provide an inexpensive semiconductor package having excellent high frequency characteristics, for mounting a high-frequency, high-power semiconductor element.

Furthermore, a back surface of the die pad 21 exposed from the encapsulation resin 16 is screwed or soldered at the cutouts 11d so as to be in direct contact with a module case or a heat sink. Accordingly, a tight contact area increases, and further tight contact is achieved. Thus, contact thermal resistance can be reduced, and heat generated by the semiconductor element 12 can be effectively dissipated.

It should be noted that although the semiconductor package 2 illustrated in FIG. 3 has a structure in which only the die pad 21 has a greater width than the encapsulation resin 16 to form the cutouts 11d for screwing, the ground enhancing metal body 15 may have a greater width than the encapsulation resin 16 to provide cutouts for screwing, similarly. This increases an area in which a heat sink and the ground enhancing metal body 15 are in tight contact, and further tight contact is achieved, thereby achieving further reduction in contact resistance and transmission loss.

Embodiment 3

In the present embodiment, a description is given of a method for fabricating a semiconductor package according to the present invention.

Figure 4:
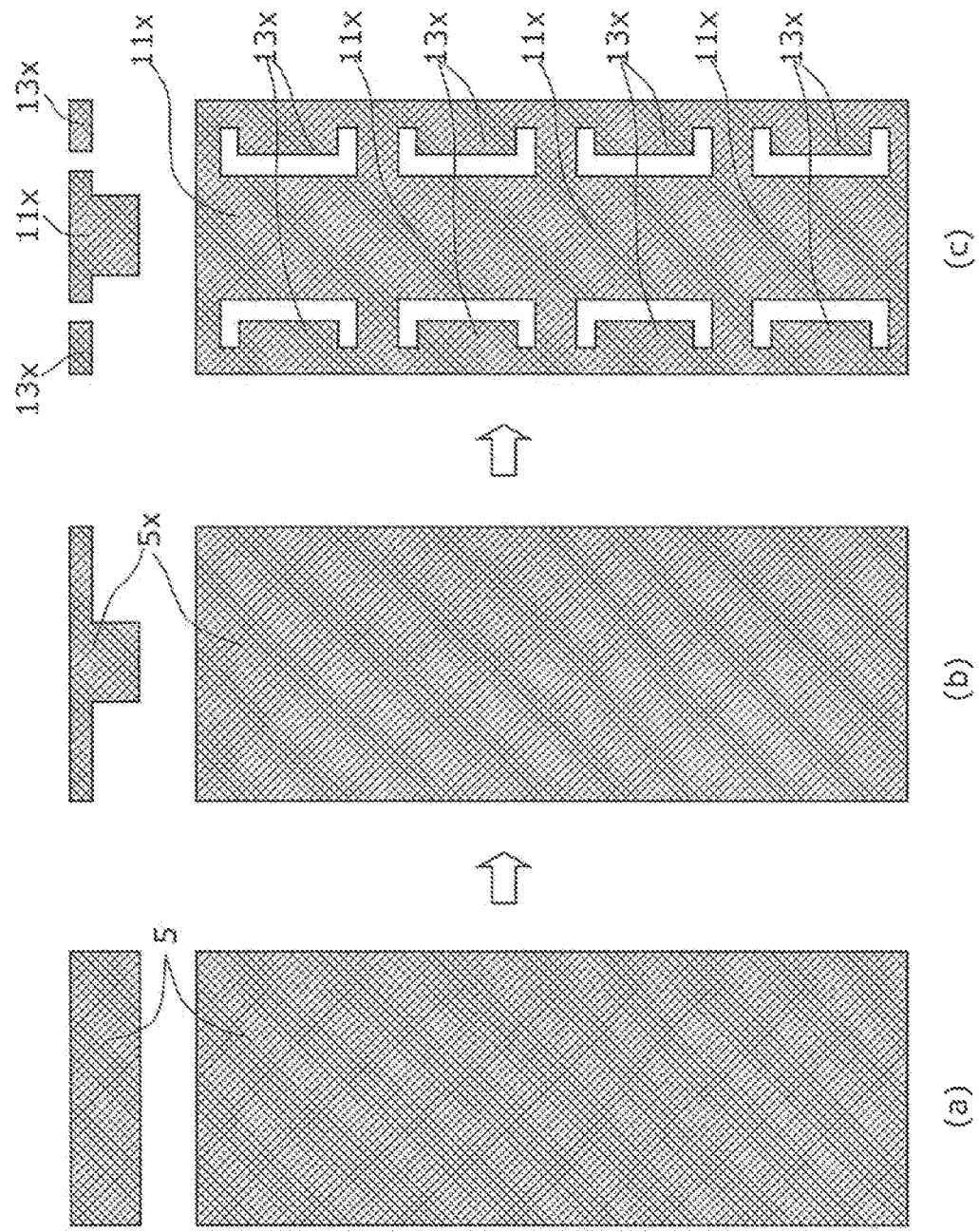
FIG. 4 illustrates a process flow regarding a lead frame for fabricating the semiconductor packages according to the present invention.

FIG. 4 is a flow chart of a production process for a lead frame for fabricating the semiconductor package according to the present invention. Further, FIG. 5 illustrates a process flow of fabricating the semiconductor package according to the present invention from the lead frame. In the method for fabricating the semiconductor package according to the present invention, steps (a) to (c) of FIG. 4 are executed, and thereafter steps (a) to (d) of FIG. 5 are executed. Specifically, (a) to (c) of FIG. 4 show a fabricating process for the lead frame from which the die pads 11 and the lead terminals 13 included in the semiconductor package 1 according to Embodiment 1 are obtained. Furthermore, (a) and (b) of FIG. 5 show steps of mounting elements onto the lead frame, (c) of FIG. 5 shows an encapsulation step using the encapsulation resin 16, and (d) of FIG. 5 shows a step of separating the lead frame into the semiconductor packages.

The fabricating method illustrated in FIGS. 4 and 5 shows an example in which each step is executed on one lead frame, that is, the die pads 11 and the lead terminals 13 connected to one another and included in four semiconductor packages. FIGS. 4 and 5 illustrate cross-sectional views and top views corresponding to the steps.

First, as illustrated in (a) of FIG. 4, a lead frame plate 5 is prepared which is a material for the die pads 11 and the lead terminals 13. In the subsequent steps, the die pads 11 and the lead terminals 13 for four semiconductor packages are formed on the single lead frame plate 5. The lead frame plate 5 is formed using rectangular parallelopiped copper basis material such as oxygen free copper, for example.

Next, as illustrated in (b) of FIG. 4, rolling is performed on edge areas on two opposite sides of the lead frame plate 5 in order to form, using the single lead frame plate 5, the lead terminals 13 and the die pads 11 having different thicknesses. Accordingly, the lead frame plate 5 is processed into a lead frame plate 5x having thin areas which are to be the lead terminals 13. In addition, it is necessary to secure a thickness of 0.5 mm or more for the center area of the lead frame plate 5x, which is to be the die pads 11, in order to effectively dissipate heat generated by the high-power semiconductor element 12.

It should be noted that a level difference which can be formed by rolling is limited, and the thickness of the areas to be the lead terminals 13 can be thinned down to ⅙ relative to the thickness of the area to be the die pads 11. For example, if the thickness of the prepared lead frame plate 5 is 1.2 mm, the portions to be the lead terminals 13 can be thinned down to the range of 0.2 to 1.2 mm.

Next, as illustrated in (c) of FIG. 4, areas between an area 11x to be a die pad and areas 13x to be lead terminals are cut out from the lead frame plate 5x by pressing or cutting, thereby forming a lead frame. However, portions other than the area on which the encapsulation resin 16 is formed are not processed, and the formed lead frame is maintained to be connected in one.

It should be noted that since a portion which has been thinned is processed to facilitate pressing or cutting, thin areas are locally generated at both edge portions of the areas 11x to be die pads. The level difference between such a locally thin area and the thick area at the center portion of the lead frame on which rolling is not performed may be utilized as the cutout 11c of the die pad 11 illustrated in FIG. 1.

It should be noted that if it is possible to make further load setting of a pressing machine, it is also possible to process part of the areas 11x to be die pads, on which rolling is not performed, and areas to be processed between the areas 11x to be die pads and the areas 13x to be lead terminals are not limited to the areas shown in (c) of FIG. 4. Accordingly, the areas 11x to be die pads have a uniform thickness without having a locally thin area.

The process illustrated in (a) to (c) of FIG. 4 described above is a process of preparing a lead frame which integrally includes the die pads 11 and the lead terminals 13.

Next, as illustrated in (a) of FIG. 5, the semiconductor elements 12 are die-bonded onto the lead frame formed in the step illustrated in (c) of FIG. 4. The step illustrated in (a) of FIG. 5 is a step of die-bonding the semiconductor elements 12 onto the main surfaces 11a of the die pads 11.

Next, as illustrated in (b) of FIG. 5, the semiconductor elements 12 die-bonded in the step illustrated in (a) of FIG. 5 are connected to the lead terminals 13 using the bonding wires 14. Here, the lead terminals 13 and the die pads 11 are formed from a single lead frame which includes the same material. The positional relationship between the semiconductor elements 12 and the lead terminals 13 is maintained. Consequently, wire bonding in this step is stabilized and furthermore, the lead terminals 13 and the die pads 11 are positioned in the mold with ease in the next process, thus achieving simplification of a fabricating process. The step illustrated in (b) of FIG. 5 is a step of electrically connecting input or output terminals of the semiconductor elements 12 which amplify a high frequency signal to the lead terminals 13 for transmitting an input high frequency signal or an amplified output high frequency signal to the semiconductor elements 12 or an external circuit.

Next, as illustrated in (c) of FIG. 5, the encapsulation resin 16 is molded so as to encapsulate the ground enhancing metal bodies 15 and the lead frame on which the semiconductor elements 12 and the bonding wires 14 are mounted in the steps illustrated in (a) and (b) of FIG. 5. At this time, the above lead frame and the ground enhancing metal bodies 15 are positioned using the mold described below using FIGS. 6A and 6B, thereby achieving a predetermined encapsulated structure described with reference to FIGS. 1 and 2. Specifically, when molding the encapsulation resin 16, the above lead frame and the ground enhancing metal bodies 15 are resin-molded at the same time.

The step illustrated in (c) of FIG. 5 described above includes: an electric conductor contact step of disposing the ground enhancing metal bodies 15 at predetermined positions in the mold in such a manner that the back surfaces 15b are in contact with the inner surface of the mold; a lead disposing step of disposing part of the lead frame in the internal space of the mold in such a manner that the back surfaces 11b of the die pads 11 are in contact with the inner surface of the mold; and a resin injection process of injecting the encapsulation resin 16 into the internal space of the mold.

Finally, as illustrated in (d) of FIG. 5, the lead frame integrally connected is cut at predetermined positions. This achieves separate semiconductor packages 1.

According to the fabricating method described above, it is possible to expose the back surface 15b of the ground enhancing metal body 15 from the encapsulation resin 16 after molding the encapsulation resin 16. Therefore, the back surface 15b is in direct contact with the ground surface on which the semiconductor package 1 is mounted, and consequently it is possible to improve the grounding strength which influences transmission characteristics of microstrip lines. Thus, a semiconductor package having low-loss high frequency characteristics can be provided as an inexpensive resin-encapsulated package.

Furthermore, it is possible to expose the back surface 11b of the die pad 11 from the encapsulation resin 16 after molding the encapsulation resin 16. Accordingly, the back surface 11b of the die pad 11 exposed from the encapsulation resin 16 is directly screwed or soldered to a module case or a heat sink, thereby allowing effective dissipation of heat generated by the semiconductor element 12.

Here, a description is given of the mold for resin molding used in the encapsulation process illustrated in (c) of FIG. 5.

Figure 6A:
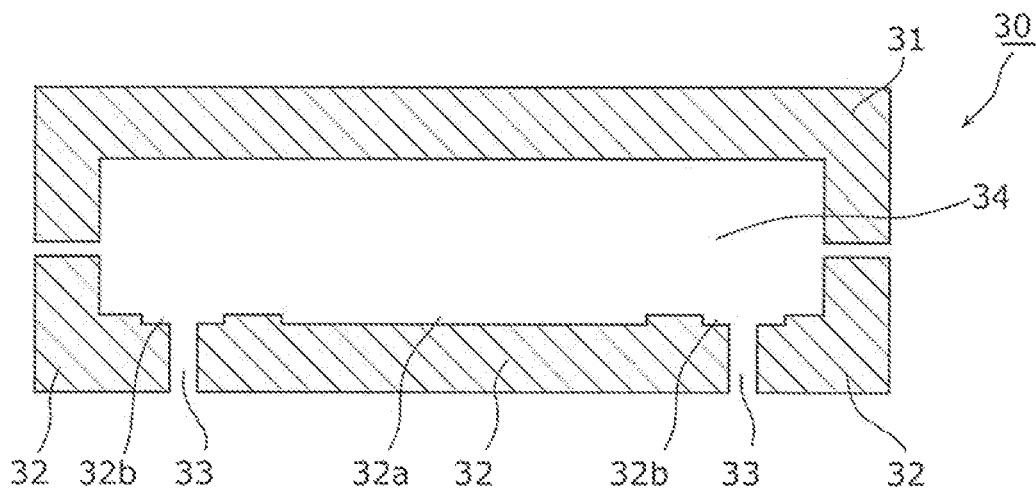
FIG. 6A is a cross-sectional view of a resin-molding mold for encapsulating in a resin the semiconductor package according to the present invention.

FIG. 6A is a cross-sectional view of a mold for resin-encapsulating the semiconductor package according to the present invention. A mold 30 illustrated in the drawing is a device for fabricating the semiconductor package 1, and includes an upper mold half 31 and a lower mold half 32. The mold 30 is a mold for simultaneously encapsulating the ground enhancing metal bodies 15 and the lead frame on which the semiconductor elements 12 are mounted, by molding the encapsulation resin 16. The upper mold half 31 is laid on the lower mold half 32, thereby securing a space 34 therebetween. Furthermore, a recessed portion 32a for positioning the lead frame and recessed portions 32b for positioning the ground enhancing metal bodies 15 are provided in the inner surface of the lower mold half 32. Furthermore, suction openings 33 for sucking the ground enhancing metal bodies 15 by vacuum are provided in the lower mold half 32. Furthermore, although not illustrated, an appropriate channel is provided in at least one of the upper mold half 31 and the lower mold half 32 so that liquid plastic such as a thermoset epoxy resin used as the encapsulation resin 16 can be injected into the space 34 and the space is filled therewith while pressure is being applied.

In the step illustrated in (c) of FIG. 5 described above, each die pad 11 is fitted into the recessed portion 32a formed in the inner surface of the lower mold half 32 so that the back surface 11b of the die pad 11 is in contact with the inner surface of the lower mold half 32. Furthermore, the ground enhancing metal bodies 15 are fitted into the recessed portions 32b formed in the inner surface of the lower mold half 32 so that the back surfaces 15b of the ground enhancing metal bodies 15 are in contact with the inner surface of the lower mold half 32.

Furthermore, in the step illustrated in (c) of FIG. 5, the ground enhancing metal bodies 15 may be sucked through the suction openings 33 formed in the lower mold half 32 so that the back surfaces 15b of the ground enhancing metal bodies 15 are in contact with the inner surface of the lower mold half 32. Furthermore, the die pads 11 may be sucked from suction openings (not illustrated) formed in the lower mold half 32 so that the back surfaces 11b of the die pads 11 are in contact with the inner surface of the lower mold half 32.

In the step illustrated in (c) of FIG. 5, the use of the recessed portions 32a and 32b and the suction openings 33 allows the ground enhancing metal bodies 15 and the die pads 11 to be brought into contact with the inner surface of the mold 30, and also the ground enhancing metal bodies 15 and the die pad 11 to be positioned with ease.

Figure 6B:
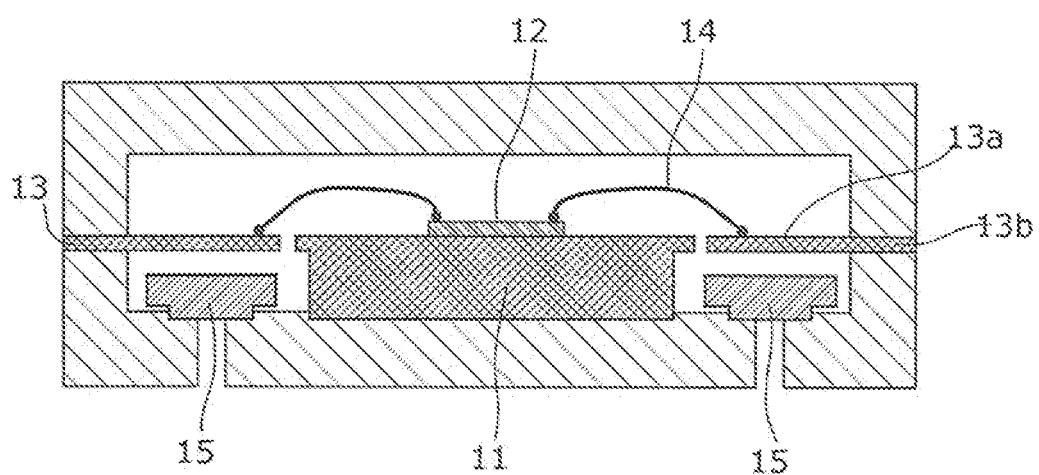
FIG. 6B is a cross-sectional view of the resin-molding mold in a state where the lead frame and ground enhancing metal bodies are placed.

FIG. 6B is a cross-sectional view of a mold for resin molding in a state where the lead frame and the ground enhancing metal bodies are placed. The drawing illustrates the mold 30 having the upper mold half 31 laying on the lower mold half 32 in a state where a lead frame on which the semiconductor element 12 is mounted and the ground enhancing metal bodies 15 are disposed at predetermined positions in the space 34. More specifically, the inner lead portions 13a, the die pad 11, the semiconductor element 12, the bonding wires 14, and the ground enhancing metal bodies 15 are disposed inside the space 34 of the mold 30. A resin is molded by, while pressure is being applied, injecting liquid plastic into and filling the space 34 in the aforementioned disposition state, thereby achieving a state where four semiconductor packages 1 are formed in one as illustrated in (c) of FIG. 5.

It should be noted that it is necessary to prevent the encapsulation resin 16 from being formed on the outer lead portions 13b by putting the outer lead portions 13b between the upper mold half 31 and the lower mold half 32, as illustrated in FIG. 6B.

In addition, it is necessary to bring the back surface 11b of the die pad 11 into tight contact with the lower mold half 32 so as to prevent the encapsulation resin 16 from being formed on the back surface 11b.

Furthermore, it is necessary to bring the back surfaces 15b of the ground enhancing metal bodies 15 into tight contact with the lower mold half 32 so as to prevent the encapsulation resin 16 from being formed on the back surfaces 15b.

An example of a method for bringing the die pad 11 and the ground enhancing metal bodies 15 into tight contact with the lower mold half 32 is to suck the die pad 11 and the ground enhancing metal bodies 15 by vacuum, by providing the suction openings 33 in the lower mold half 32, as illustrated in FIG. 6B.

Furthermore, rather than providing the suction openings for sucking by vacuum described above, the back surfaces 11b and 15b may be in tight contact with the lower mold half 32 by providing projections on the inner surface of the upper mold half 31 so as to hold down part of the die pad 11 and the ground enhancing metal bodies 15 when the upper mold half 31 is laid on the lower mold half 32.

The use of the mold 30 according to the present embodiment in the process of fabricating the semiconductor package according to the present invention allows the back surfaces 15b of the ground enhancing metal bodies 15 to be disposed in contact with the inner surface of the mold 30 with ease. Thus, the back surfaces 15b of the ground enhancing metal bodies 15 corresponding to a ground layer are in direct contact with the ground surface on which a semiconductor package is mounted, the ground enhancing metal bodies 15 being for using the inner lead portions 13a as microstrip lines. Thus, it is possible to improve grounding strength important for transmission characteristics of microstrip lines. Furthermore, electric conductors can be positioned with ease in a step for preparing a resin injection step, thus simplifying the fabricating process.

Although the above is a description of a semiconductor package and a method and a mold for fabricating the same according to the present invention based on the embodiments, the present invention is not limited to the embodiments described above. Modifications obtained by applying various changes which can be conceived by a person skilled in the art to the embodiments of the present invention are also included in the present invention without departing from the scope of the present invention. The constituent elements in the embodiments may be arbitrarily combined without departing from the scope of the present invention.

It should be noted that as an example of achieving the method for fabricating the semiconductor package 1 according to Embodiment 1, although the die pads 11 and the lead terminals 13 are formed using a single lead frame which includes the same material in Embodiment 3, the method for fabricating the semiconductor package 1 according to the present invention is not limited to this. As another aspect of achieving the method for fabricating the semiconductor package according to the present invention, the die pads and the ground enhancing metal bodies may be formed using a single lead frame, and the lead terminals may be formed separately. The following is a description of this aspect.

Figure 7:
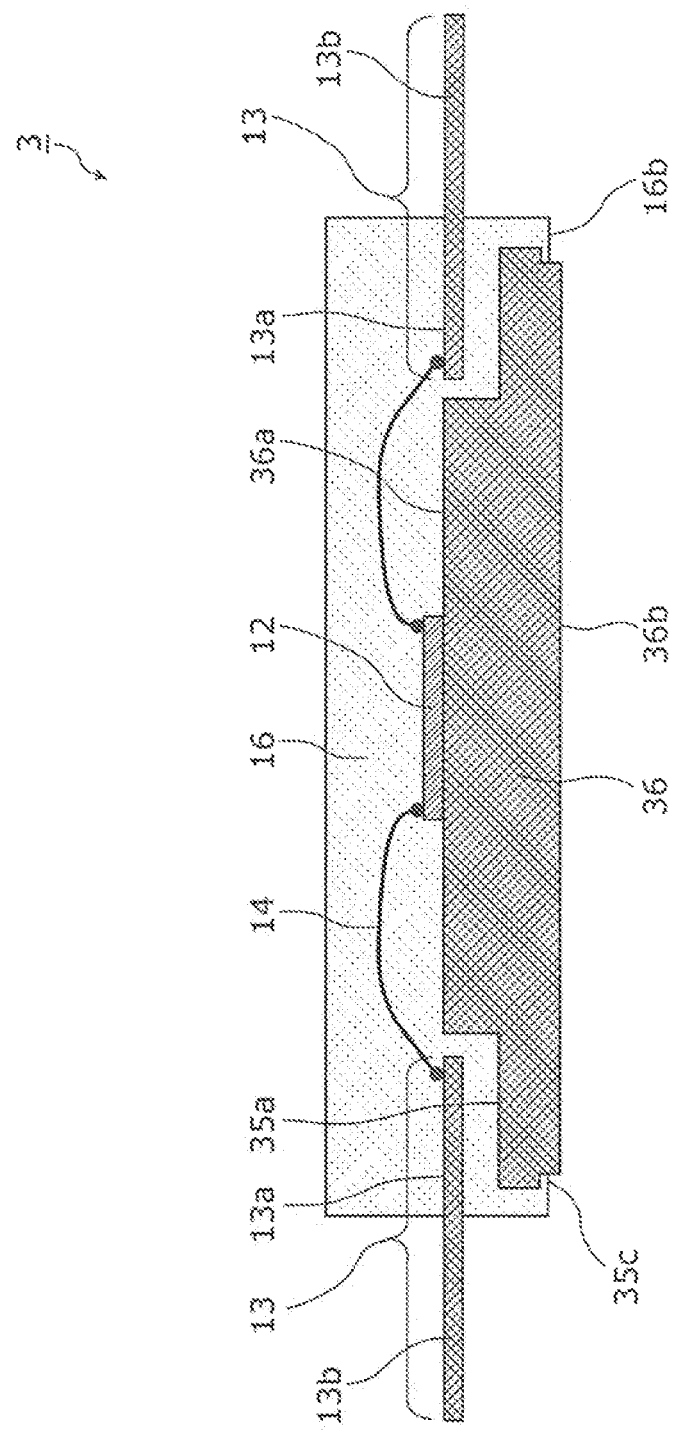
FIG. 7 is a cross-sectional view of a structure of a variation of the semiconductor package according to Embodiment 1 of the present invention.
Figure 8:
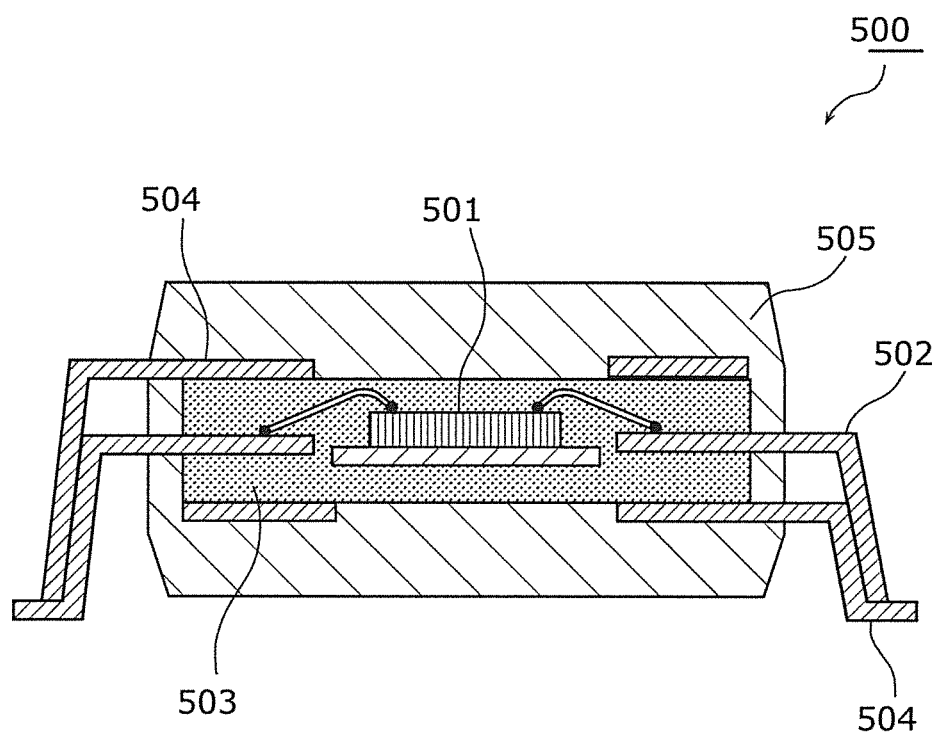
FIG. 8 is a cross-sectional view illustrating a structure of a mold package disclosed in PTL 2.

FIG. 7 is a cross-sectional view of a structure illustrating a variation of the semiconductor package according to Embodiment 1 of the present invention. A semiconductor package 3 illustrated in the drawing is a resin-encapsulated package, and includes a die pad 36, the semiconductor element 12, the plural lead terminals 13, the bonding wires 14, and the encapsulation resin 16. The structure of the semiconductor package 3 according to the present embodiment is different from the semiconductor package 1 according to Embodiment 1, in that the ground enhancing metal bodies are part of the die pad 36.

The encapsulation resin 16 is a resin for encapsulating the die pad 36, the semiconductor element 12, the inner lead portions 13a, and the bonding wires 14 such that a back surface 36b of the die pad 36 and the outer lead portions 13b are exposed.

The die pad 36 includes two main surfaces 35a and 36a, and cutouts 35c are provided at the edge portions of the back surface 36b.

The characteristic impedance of the inner lead portions 13a is determined depending on dielectric constant of the encapsulation resin 16, the width of the inner lead portions 13a, and a distance between the main surface 35a of the die pad 36 and the back surfaces of the inner lead portions 13a.

The semiconductor package 3 having the aforementioned structure is achieved by using a lead frame which integrally includes the ground enhancing metal bodies and the die pads. Specifically, the semiconductor package 3 is fabricated using this lead frame by executing the steps of die-bonding the semiconductor elements 12, wire-bonding, disposing the lead frame and the lead terminals 13, and injecting the resin. According to the semiconductor package 3 which is a variation of Embodiment 1 according to the present invention, the ground enhancing metal bodies and the die pad which are integrally formed can be simultaneously brought into contact with the same surface of a high frequency substrate on which the semiconductor package 3 is mounted, and thus ground enhancement in view of high frequency transmission characteristics and a mounting process for dissipating heat from a semiconductor element can be effectively achieved in a simplified manner.

It should be noted that in Embodiments 1 to 3, a high frequency signal is a signal having a frequency of hundreds of MHz or more.

Furthermore, the present invention can be achieved not only as the semiconductor package described above, and the method and the mold for fabricating the same, but also as an input or output terminal of the semiconductor package. Specifically, the input or output terminal of the semiconductor package according to the present invention includes: the planar lead terminal 13 which propagates a high frequency signal; the encapsulation resin 16 for encapsulating the lead terminal 13 and also the semiconductor element 12 such that an end of the lead terminal 13 is exposed; the ground enhancing metal body 15 having the main surface 15a which is the first main surface and the back surface 15b which is the second main surface opposite to the main surface 15a, and encapsulated in the encapsulation resin 16 such that the main surface 15a faces the lead terminal 13 and the back surface 15b is exposed from the encapsulation resin 16. The lead terminal 13, the ground enhancing metal body 15, and the encapsulation resin 16 form a strip line or a microstrip line. According to this, the back surface 15b of the ground enhancing metal body 15 can be in direct contact with the ground surface, and thus it is possible to improve the grounding strength which influences transmission characteristics of a microstrip line. Thus, low-loss high frequency signal transmission can be achieved by using a resin which is an inexpensive material for a semiconductor package. The input or output terminal of the above-described semiconductor package is also included in the technical scope of the present invention.

INDUSTRIAL APPLICABILITY

The semiconductor package according to the present invention is applicable to a base station for mobile communications which handles a high frequency signal at high power output, and a microwave home electric appliance such as a microwave.

REFERENCE SIGNS LIST 1, 2, 3 Semiconductor package
5, 5x Lead frame plate
11, 21, 36 Die pad
11a, 15a, 35a, 36a Main surface
11b, 15b, 16b, 36b Back surface
11c, 11d, 15c, 35c Cutout
11x Area to be die pad
12, 501 Semiconductor element
13 Lead terminal
13a Inner lead portion
13b Outer lead portion
13x Area to be lead terminal
14 Bonding wire
15 Metal body for ground enhancement
16 Encapsulation resin
30 Mold
31 Upper mold half
32 Lower mold half
32a, 32b Recessed portion
33 Suction opening
34 Space
500 Mold package
502 First external lead
503 First resin
504 Second external lead
505 Second resin

The invention claimed is:
1. A semiconductor package comprising:
a semiconductor element where a high frequency signal is input and/or output;
a planar lead for transmitting the high frequency signal to the semiconductor element or an external circuit, the lead having an end electrically connected to an input terminal or an output terminal of the semiconductor element;
a resin for encapsulating the lead and the semiconductor element, the lead having another end exposed from the resin; and
an electric conductor for ground enhancement having a first main surface and a second main surface opposite to the first main surface, and encapsulated in the resin, the first main surface facing the lead with the resin therebetween, the second main surface being exposed from the resin,
wherein the electric conductor has a shape with a cross section parallel to the second main surface and having a smaller area than an area of the first main surface.

2. The semiconductor package according to claim 1, further comprising
a planar die pad having a top surface on which the semiconductor element is disposed,
wherein the die pad is encapsulated in the resin such that at least a portion of an undersurface of the die pad is exposed from the resin.

3. The semiconductor package according to claim 2, wherein a top surface of the lead and the top surface of the die pad are located on a same plane.

4. The semiconductor package according to claim 2, wherein a distance between a side surface of the die pad facing the lead and a side surface of the lead facing the die pad is equal to a distance between the side surface of the die pad facing the electric conductor and a side surface of the electric conductor facing the die pad.

5. The semiconductor package according to claim 2, wherein the lead and the die pad include a same material.

6. The semiconductor package according to claim 2, wherein the second main surface of the electric conductor is located on a same side as the undersurface of the die pad, relative to the lead.

7. The semiconductor package according to claim 6, wherein the second main surface of the electric conductor is located on a same plane as the undersurface of the die pad.

8. The semiconductor package according to claim 2, wherein the electric conductor is part of the die pad.

9. The semiconductor package according to claim 2, wherein the lead is thinner than the die pad.

10. The semiconductor package according to claim 1, wherein when a direction parallel to the first main surface and perpendicular to a direction in which the high frequency signal is transmitted is a width direction, the electric conductor is larger in width than the lead in a portion in which the lead and the electric conductor face each other.

11. The semiconductor package according to claim 2, wherein the die pad has a shape with a cross section parallel to the undersurface and having a smaller area than an area of the top surface.

12. A semiconductor package comprising:
a semiconductor element where a high frequency signal is input and/or output;
a planar lead for transmitting the high frequency signal to the semiconductor element or an external circuit, the lead having an end electrically connected to an input terminal or an output terminal of the semiconductor element;
a resin for encapsulating the lead and the semiconductor element, the lead having another end exposed from the resin;
an electric conductor for ground enhancement having a first main surface and a second main surface opposite to the first main surface, and encapsulated in the resin, the first main surface facing the lead with the resin therebetween, the second main surface being exposed from the resin; and
a planar die pad having a top surface on which the semiconductor element is disposed,
wherein the die pad is encapsulated in the resin such that at least a portion of an undersurface of the die pad is exposed from the resin, and
the at least a portion of the undersurface of the die pad exposed from the resin is projecting out from a surface of the resin surrounding the portion.

13. A semiconductor package comprising:
a semiconductor element where a high frequency signal is input and/or output;
a planar lead for transmitting the high frequency signal to the semiconductor element or an external circuit, the lead having an end electrically connected to an input terminal or an output terminal of the semiconductor element;
a resin for encapsulating the lead and the semiconductor element, the lead having another end exposed from the resin; and
an electric conductor for ground enhancement having a first main surface and a second main surface opposite to the first main surface, and encapsulated in the resin, the first main surface facing the lead with the resin therebetween, the second main surface being exposed from the resin,
wherein the second main surface of the electric conductor is projecting out from a surface of the resin surrounding the second main surface.

14. A method for fabricating a semiconductor package, comprising:
(a) electrically connecting an input terminal or an output terminal of a semiconductor element where a high frequency signal is input and/or output, and a planar lead for transmitting the high frequency signal to the semiconductor element or an external circuit;
(b) disposing, at a predetermined position in a mold, an electric conductor for ground enhancement having a first main surface and a second main surface opposite to the first main surface, the second main surface being in contact with an inner surface of the mold;
(c) disposing part of the lead and the semiconductor element in an internal space of the mold, the lead facing the first main surface; and
(d) injecting a resin into the internal space of the mold, and further comprising before step (a):
(e) preparing a lead frame which integrally includes a planar die pad and the lead; and
(f) die-bonding the semiconductor element onto a top surface of the die pad,
wherein in step (c),
the lead is disposed such that the resin is included between the lead and the first main surface,
the lead frame is disposed at a predetermined position in the mold such that at least a portion of an undersurface of the die pad is in contact with the inner surface of the mold, and
the die pad is fitted into a recessed portion formed in the inner surface of the mold such that the at least a portion of the undersurface of the die pad is in contact with the inner surface of the mold.

15. The method for fabricating the semiconductor package according to claim 14,
wherein in step (c), the die pad is sucked through a suction opening formed in the mold to bring the at least a portion of the undersurface of the die pad into contact with the inner surface of the mold.

16. The method for fabricating the semiconductor package according to claim 14,
wherein in step (b), the electric conductor is fitted into a recessed portion formed in the inner surface of the mold such that the second main surface is in contact with the inner surface of the mold.

17. The method for fabricating the semiconductor package according to claim 14,
wherein in step (b), the electric conductor is sucked through a suction opening formed in the mold to bring the second main surface into contact with the inner surface of the mold.

18. A mold for fabricating a semiconductor package, the semiconductor package including:

a semiconductor element where a high frequency signal is input and/or output;

a planar lead for transmitting the high frequency signal to the semiconductor element or an external circuit, the lead having an end electrically connected to an input terminal or an output terminal of the semiconductor element;

a resin for encapsulating the lead and the semiconductor element, the lead having another end exposed from the resin; and an electric conductor for ground enhancement having a first main surface facing the lead and a second main surface opposite to the first main surface, and encapsulated in the resin, the second main surface being exposed from the resin, the mold having a recessed portion which is formed in an internal surface, and in which the second main surface is in contact with the internal surface.

* * * * *